US012640748B2

(12) United States Patent
Lee et al.

(10) Patent No.:  US 12,640,748 B2
(45) Date of Patent:  May 26, 2026

(54) SYSTEM AND METHODS FOR CONFIGURABLE INPUT CHANNEL MULTIPLEXING

(71) Applicant: Microchip Technology Incorporated, Chandler, AZ (US)

(72) Inventors: Thomas Youbok Lee, Chandler, AZ (US); Ibiyemi Omole, Gilbert, AZ (US); Jimmy Yu, Chandler, AZ (US); Iman Chalabi, Phoenix, AZ (US); John Venancio Dela Pena, Chandler, AZ (US); Hadj Attlassy, Gilbert, AZ (US)

(73) Assignee: Microchip Technology Incorporated, Chandler, AZ (US)

( * ) Notice: Subject to any disclaimer, the term of this patent is extended or adjusted under 35 U.S.C. 154(b) by 168 days.

(21) Appl. No.: 18/437,457

(22) Filed: Feb. 9, 2024

(65) Prior Publication Data

US 2025/0150088 A1     May 8, 2025

Related U.S. Application Data

(60) Provisional application No. 63/597,109, filed on Nov. 8, 2023.

(51) Int. Cl.
*H03M 1/12*          (2006.01)
(52) U.S. Cl.
CPC ................................. *H03M 1/1205* (2013.01)
(58) Field of Classification Search
CPC . H03M 1/1205; H03M 1/0682; H03M 1/1225
See application file for complete search history.

(56) References Cited

U.S. PATENT DOCUMENTS 7,400,283 B1     7/2008  Zhu et al. ..................... 341/141
7,411,533 B2 *  8/2008  Posamentier ....... H03M 1/1225
                                              341/122
8,085,179 B2 *  12/2011  Hainz ................. H03M 1/1225
                                              341/155

(Continued)

OTHER PUBLICATIONS

Analog Devices, "AD7124-8: 8-Channel, Low Noise, Low Power, 24-Bit, Sigma-Delta ADC with PGA and Reference," URL: https://web.archive.org/web/20230126040200/https://www.analog.com/media/en/technical-documentation/data-sheets/ad7124-8.pdf, 94 pages, Apr. 30, 2018.

(Continued)

*Primary Examiner* — Jean B Jeanglaude
(74) *Attorney, Agent, or Firm* — SLAYDEN GRUBERT BEARD PLLC

(57)                    ABSTRACT

A multi-channel ADC system may include a plurality of input channels coupled to input signals. A multiplexer may couple one or more of the plurality of input channels to one or more multiplexer output channels. A control circuit may be coupled between the multiplexer output channels and an ADC. In operation, a configuration setting may configure the multi-channel ADC system in one of a plurality of configurations, including but not limited to single-ended, differential, pseudo-differential and hybrid configurations. The ADC may convert the plurality of input channels based on the configuration setting.

23 Claims, 7 Drawing Sheets

(56) References Cited

U.S. PATENT DOCUMENTS

| | | | | |
|---|---|---|---|---|
| 8,922,411 | B2* | 12/2014 | Ullmann | H03M 3/392 |
| | | | | 341/120 |
| 9,432,035 | B2* | 8/2016 | Vyas | H03M 1/1225 |
| 9,479,188 | B1* | 10/2016 | Mason | H03M 1/1225 |
| 2012/0050081 | A1* | 3/2012 | Bright | H03M 1/1215 |
| | | | | 341/122 |

OTHER PUBLICATIONS

Texas Instruments, "ADS112U04 16-Bit, 4-Channel, 2-kSPS, Delta-Sigma ADC With UART Interface," URL: https://www.ti.com/lit/ds/symlink/ads112u04.pdf, 77 pages, Oct. 31, 2018.
International Search Report and Written Opinion, Application No. PCT/US2024/028280, 12 pages, Aug. 29, 2024.

* cited by examiner

600

610 — COUPLE PLURALITY OF INPUTS TO MULTIPLEXER

620 — CONFIGURE MULTIPLEXER

630 — COUPLE INPUTS TO MULTIPLEXER OUTPUT CHANNELS

640 — CONVERT CHANNELS IN ADC

SYSTEM AND METHODS FOR CONFIGURABLE INPUT CHANNEL MULTIPLEXING

PRIORITY

This application claims priority to commonly owned U.S. Provisional Patent Application No. 63/597,109 filed Nov. 8, 2023, the entire contents of which are hereby incorporated by reference for all purposes.

FIELD OF THE INVENTION

The present disclosure relates to multiplexing input channels, more specifically to multiplexing input channels in a multi-channel analog-to-digital converter (ADC).

BACKGROUND

In high-density multi-channel ADC applications, it may be desirable to allow input channels to be configured for different input types. Input types may include single-ended, differential and pseudo-differential inputs. Additionally, individual channels may be mapped to one or more inputs of the ADC.

A circuit such as a multiplexer may be used to map input channels to multiplexer output channels. In one of various examples, each input channel may include separate configuration settings to specify the input type, and to specify the mapping between input channels and multiplexer output channels. In applications with many input channels and many multiplexer output channels, this may be a complicated mapping and may be confusing to a user.

There is a need for a simple and easy-to-use system and method to allow for programming multi-channel inputs with different input types and with different mappings.

SUMMARY

The examples herein enable a system for a high-density multichannel analog-to-digital converter (ADC).

According to one aspect, a system includes a configuration setting to configure a plurality of input signals in one of a plurality of configurations. The configuration setting may comprise a 2-bit register value. A multiplexer may be coupled to the plurality of input signals, the multiplexer to couple at least one of the plurality of input signals to at least one multiplexer output channel based on the configuration setting. The system may include an analog-to-digital converter (ADC). The system may include a control circuit to couple the at least one multiplexer output channel to the ADC, the ADC to convert the at least one multiplexer output channel.

According to one aspect, a method includes steps of: coupling a plurality of input signals to a multiplexer, configuring the multiplexer in one of a plurality of configurations based on a configuration setting, the configuration setting comprising a 2-bit register value, coupling, by the multiplexer, at least one of a plurality of inputs to at least one multiplexer output channel, the coupling based on the configuration setting, and converting the at least one multiplexer output channel in an analog-to-digital converter (ADC).

DETAILED DESCRIPTION

Figure 1A:
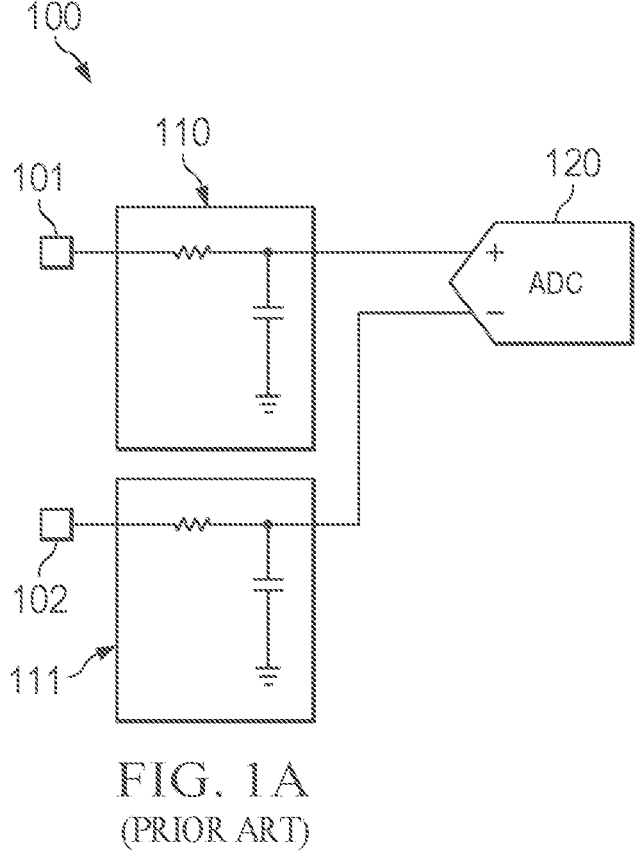
FIG. 1A illustrates one of various examples of a differential input ADC system.

FIG. 1A illustrates one of various examples of a differential input ADC system 100 according to the prior art. A first input channel 101 may be coupled to first input circuit 110. The output of first input circuit 110 may be coupled to a positive input of ADC 120. Second input channel 102 may be coupled to second input circuit 111. The output of second input circuit 111 may be coupled to a negative input of ADC 120. First input circuit 110 and second input circuit 111 may include passive resistors and capacitors as illustrated in FIG. 1A or may include passive and active components not specifically illustrated in FIG. 1A, including but not limited to operational amplifiers.

Figure 1B:
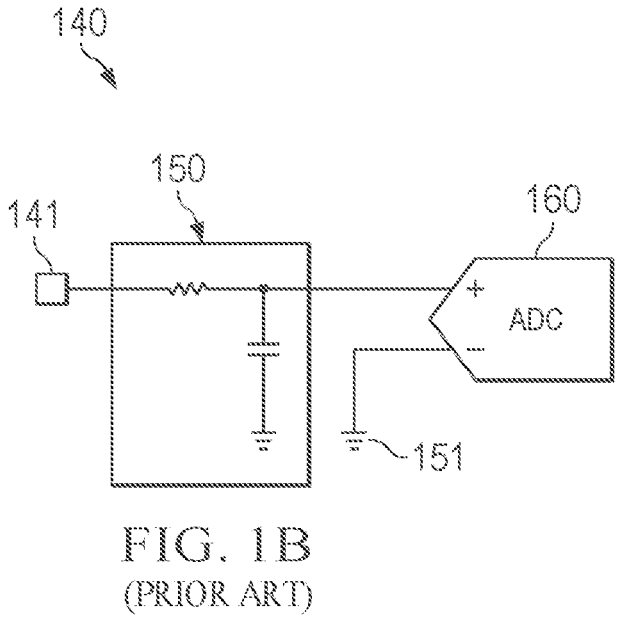
FIG. 1B illustrates one of various examples of a single-ended input ADC system.

FIG. 1B illustrates one of various examples of a single-ended input ADC system 140 according to the prior art. An input channel 141 may be coupled to an input circuit 150. The output of input circuit 150 may be coupled to a positive input of an ADC 160. Ground node 151 may be coupled to the negative input of ADC 160. Input circuit 150 may include passive resistors and capacitors as illustrated in FIG. 1B or may include passive and active components not specifically illustrated in FIG. 1B, including but not limited to operational amplifiers.

Figure 1C:
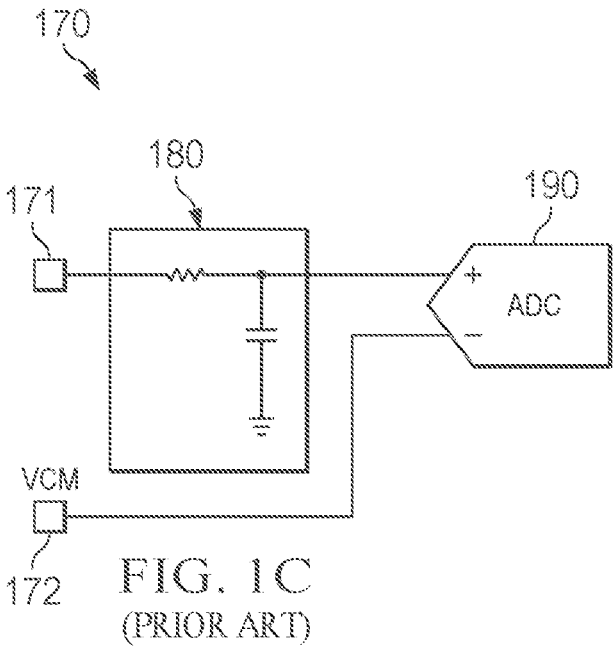
FIG. 1C illustrates one of various examples of a pseudo-differential input ADC system.

FIG. 1C illustrates one of various examples of a pseudo-differential input ADC system 170 according to the prior art. A first input channel 171 may be coupled to an input circuit 180. The output of input circuit 180 may be coupled to a positive input of an ADC 190. A second input channel 172 may be coupled to a common mode voltage (VCM). Second input channel 172 may be coupled to the negative input of ADC 190. Positive input circuit 180 may include passive resistors and capacitors as illustrated in FIG. 1C or may include passive and active components not specifically illustrated in FIG. 1C.

Figure 2:
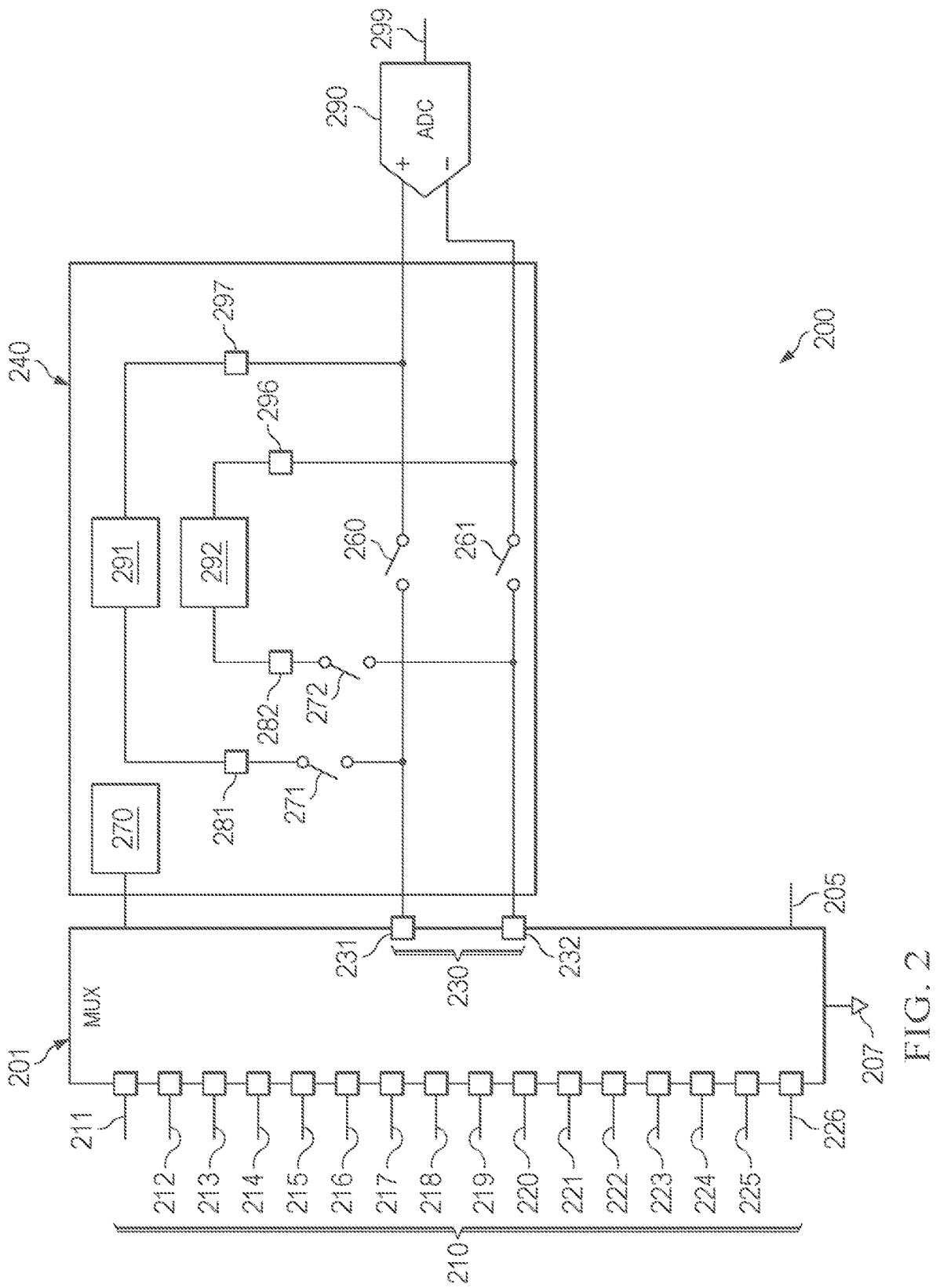
FIG. 2 illustrates one of various examples of a multi-channel ADC system in a differential configuration.

FIG. 2 illustrates one of various examples of a multi-channel ADC system 200 in a differential configuration. Configuration setting 205 may specify one of a plurality of configurations. In the example illustrated in FIG. 2, configuration setting 205 may specify that input channels 210 may be configured as differential channels. In other examples, only some of input channels may be configured as differential channels. In one of various examples, configuration setting 205 may comprise the output of a 2-bit register setting. Multiplexer 201 may map one or more of input channels 210 to one or more of multiplexer output channels 230 based on configuration setting 205. Node 207 may be a common connection, including but not limited to a ground connection or a negative supply voltage.

Multi-channel ADC system 200 may include an ADC 290 with two or more channels for converting two or more data inputs. Multi-channel ADC system 200 may include multiplexer 201 to couple one or more input channels 210 to one or more multiplexer output channels 230. Input channels 210 may be coupled to analog input signals. The example illustrated in FIG. 2 includes 16 inputs, but this is not intended to be limiting. In the example illustrated in FIG. 2, a channel sequencer 270 may control multiplexer 201 such that ADC 290 may convert any of the plurality of input channels 210. ADC 290 may output digital code 299.

Multiplexer 201 may couple one or more of the plurality of input channels 210 to one or more of a plurality of multiplexer output channels 230. In the example illustrated in FIG. 2, multiplexer 201 may include 16 input channels, individually labelled 211, 212, 213, 214, 215, 216, 217, 218, 219, 220, 221, 222, 223, 224, 225 and 226. Each of 16 input channels 211, 212, 213, 214, 215, 216, 217, 218, 219, 220, 221, 222, 223, 224, 225 and 226 may be coupled to an input signal. Some of the plurality of input channels 210 may be coupled to the same input signal. Some of the plurality of input channels 210 may be coupled to different input signals.

Channel sequencer 270, first conditioning circuit 291, second conditioning circuit 292, and switches 260, 261, 271, 272 may comprise a control circuit 240. Control circuit 240 may couple multiplexer output channels 230 to ADC 290.

In the example illustrated in FIG. 2, multiplexer output channels 230 may be differential channels, comprising a first multiplexer output channel 231 and a second multiplexer output channel 232. First multiplexer output channel 231 may be coupled to a first end of switch 271 and to a first end of switch 260. Second multiplexer output channel 232 may be coupled to a first end of switch 272 and to a first end of switch 261.

A second end of switch 271 may be coupled to first multiplexer output pin 281. First multiplexer output pin 281 may be coupled to an input of first conditioning circuit 291. First conditioning circuit 291 may include one or more amplifiers, a low-pass filter, a high-pass filter, a band-pass filter, a band-stop filter or other filter structures not specifically mentioned. First conditioning circuit 291 may include passive components, active components, or a combination of passive and active components. The output of first conditioning circuit 291 may be coupled to first ADC input pin 297. First ADC input pin 297 may be coupled to a positive input of ADC 290. The term pin, as used herein, is not meant to be limited to any particular type of physical structure, and may include, without limitation, gull-wing or J-lead terminals, solder balls, or lands.

Switch 260 may be coupled between first multiplexer output channel 231 and the positive input of ADC 290, i.e. the second end of switch 260 may be coupled to the positive input of ADC 290.

First conditioning circuit 291 and second conditioning circuit 292 may be external circuits, functioning as either active or passive filters, or signal sources. Input channels 210 may share a common first conditioning circuit 291 and second conditioning circuit 292, including but not limited to an active buffer, a voltage follower, or a passive RC filter. The use of multiplexer 201 may enable first conditioning circuit 291 and second conditioning circuit 292 to be utilized by any one of input channels 210, eliminating the need for dedicated conditioning circuits for respective input channels 210.

In operation, in an external mode, switch 260 and switch 261 may be in an open position and switch 271 and switch 272 may be in a closed position, such that first ADC input pin 297 may provide input to the positive input of ADC 290 and second ADC input pin 296 may provide input to the negative input of ADC 290. First conditioning circuit 291 may condition the signal received from first multiplexer output channel 231 at first multiplexer output pin 281 and may provide the conditioned signal at the positive input of ADC 290 through first ADC input pin 297. Second conditioning circuit 292 may condition the signal received from second multiplexer output channel 232 at second ADC input pin 282 and provide the conditioned signal at the negative input of ADC 290 through second ADC input pin 296. In operation, in an internal mode, switch 260 and switch 261 may be in a closed position and switch 271 and switch 272 may be in an open position, such that first multiplexer output channel 231 and second multiplexer output channel 232 may be input to the positive input and negative input of ADC 290, respectively, without passing through first conditioning circuit 291 and second conditioning circuit 292.

A second end of switch 272 may be coupled to second multiplexer output pin 282. Second multiplexer output pin 282 may be coupled to an input of second conditioning circuit 292. Second conditioning circuit 292 may include one or more amplifiers, a low-pass filter, a high-pass filter, a band-pass filter, a band-stop filter or other filter structures not specifically mentioned. Second conditioning circuit 292 may include passive components, active components, or a combination of passive and active components. The output of second conditioning circuit 292 may be coupled to second ADC input pin 296. Second ADC input pin 296 may be coupled to a negative input of ADC 290.

Switch 261 may be coupled between second multiplexer output channel 232 and the negative input of ADC 290, i.e. the second end of switch 261 may be coupled to the negative input of ADC 290.

In operation, channel sequencer 270 may control multiplexer 201 and may instruct multiplexer 201 to sequentially couple pairs of input channels 210 to multiplexer output channels 230. As one of various examples, when configured in a differential configuration, during a first time period, channel sequencer 270 may instruct multiplexer 201 to couple input channel 211 to first multiplexer output channel 231 and to couple input channel 212 to second multiplexer output channel 232. Control circuit 240 may operate in either internal mode or external mode and may convert the differential pair of input channel 211 and input channel 212 at ADC 290. During a second time period, channel sequencer 270 may instruct multiplexer 201 to couple input channel 213 to first multiplexer output channel 231 and to couple input channel 214 to second multiplexer output channel 232.

Control circuit 240 may operate in either internal mode or external mode and may convert the differential pair of input channel 213 and input channel 214 at ADC 290. Channel sequencer 270 may continue to instruct multiplexer 201 to couple pairs of input channels to ADC 290 and may enable multi-channel ADC system 200 to convert all input channels 210 in sequence. In this manner, system 200 may implement a multi-channel ADC system.

The example of FIG. 2 illustrates a system for converting input channels in sequence, from input channel 211 to input channel 226, but this is not intended to be limiting. Channel sequencer 270 may instruct multiplexer 201 to couple input channels in any order. Channel sequencer 270 may instruct multiplexer 201 to couple all input channels as differential channels and convert all channels at ADC 290 or may couple a subset of input channels 210 as differential channels and may convert a subset of input channels at ADC 290.

Figure 3:
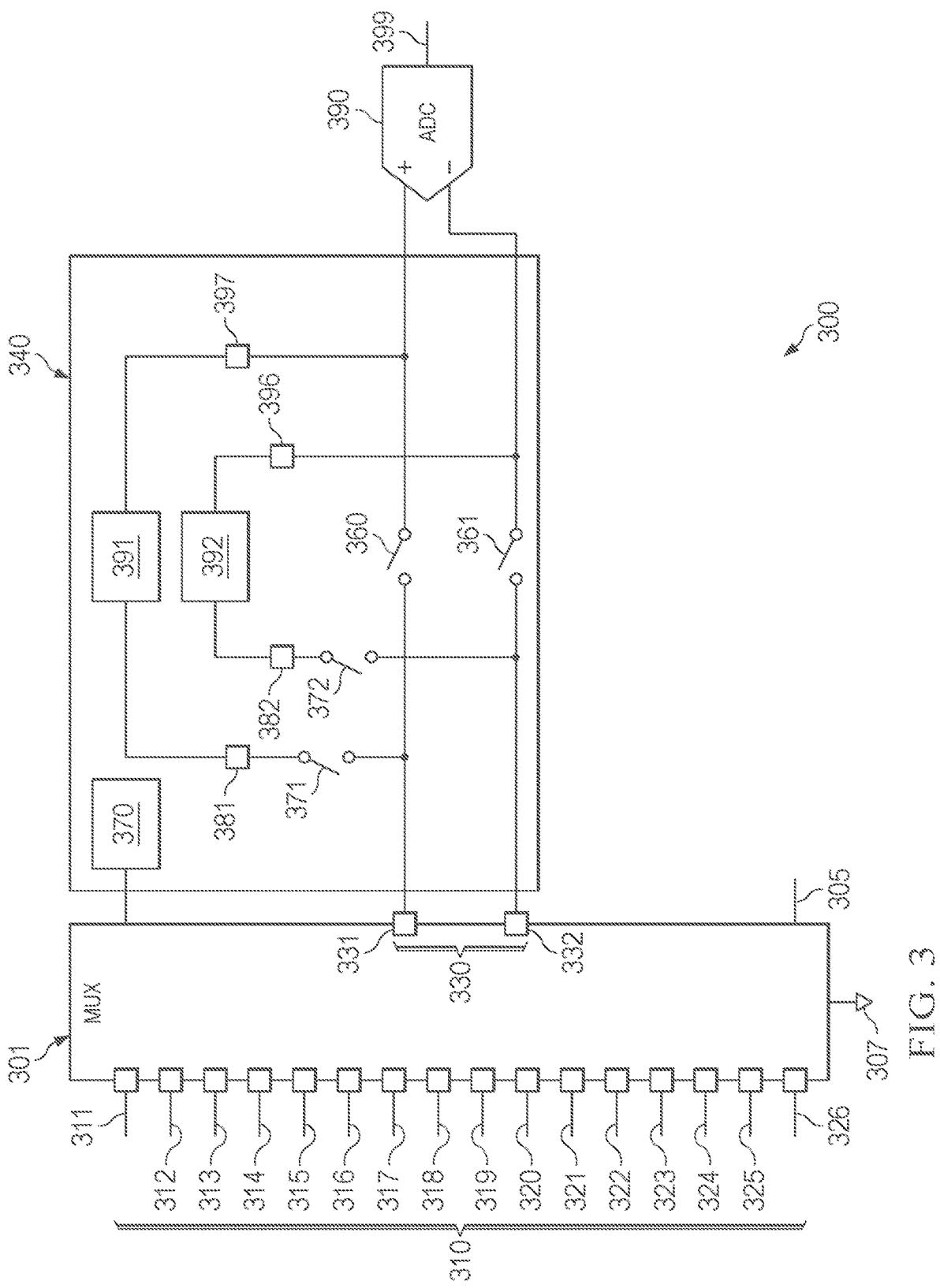
FIG. 3 illustrates one of various examples of a multi-channel ADC system in a pseudo-differential configuration.

FIG. 3 illustrates one of various examples of a multi-channel ADC system 300 in a pseudo-differential configuration. Configuration setting 305 may specify one of a plurality of configurations. In the example illustrated in FIG. 3, configuration setting 305 may specify channels in a pseudo-differential configuration. In pseudo-differential input configurations, one of input channels 310 may be a common mode input for the pseudo-differential input signal. All other inputs, excepting the common mode input, may be single-ended signal inputs. The common mode input may be mapped to second multiplexer output channel 332 and another of input channels 310 may be mapped to first multiplexer output channel 331, based on configuration setting 305. In other examples, input channels 310 may be configured in a different configuration. In one of various examples, configuration setting 305 may comprise an output of a 2-bit register setting. Multiplexer 301 may map one or more of input channels 310 to one or more of multiplexer output channels 330 based on configuration setting 305. Node 307 may be a common connection, including but not limited to a ground connection or a negative supply voltage.

Multi-channel ADC system 300 may include an ADC with high channel density, with two or more channels for converting two or more data inputs. Multi-channel ADC system 300 may include multiplexer 301 to couple one or more input channels to one or more multiplexer output channels. Input channels 310 may be coupled to analog input signals. ADC 390 may output digital code 399.

The example illustrated in FIG. 3 includes 16 inputs, but this is not intended to be limiting. In the example illustrated in FIG. 3, a channel sequencer 370 may control multiplexer 301 such that ADC 390 may be connected so as to convert any of the plurality of input channels 310.

Multiplexer 301 may couple one or more of the plurality of input channels 310 to one or more of a plurality of multiplexer output channels 330. In the example illustrated in FIG. 3, multiplexer 301 may include 16 input channels, individually labelled 311, 312, 313, 314, 315, 316, 317, 318, 319, 320, 321, 322, 323, 324, 325 and 326. Each of 16 input channels 311, 312, 313, 314, 315, 316, 317, 318, 319, 320, 321, 322, 323, 324, 325 and 326 may be coupled to an input signal. Some of the plurality of input channels 310 may be coupled to the same input signal. Some of the plurality of input channels 310 may be coupled to different input signals.

In the example illustrated in FIG. 3, input channel 311 may be coupled to a common mode voltage. Input channel 311 may provide a common mode voltage for other input channels. As one of various examples, input channel 311 may provide a common mode voltage for converting a signal on input channel 312. In other examples, any of input channels 310 may be coupled to a common mode voltage. The common mode voltage may be coupled to second multiplexer output channel 332. In other examples, the common mode voltage may be coupled directly to the negative input of ADC 390 via closed switch 361.

In the example illustrated in FIG. 3, multiplexer output channels 330 may be pseudo-differential channels. Multiplexer 301 may couple one of input channels 312, 313, 314, 315, 316, 317, 318, 319, 320, 321, 322, 323, 324, 325, 326 to first multiplexer output channel 331. Multiplexer 301 may couple input channel 311 to second multiplexer output channel 332. First multiplexer output channel 331 may be coupled to a first end of switch 371 and a first end of switch 360. Input channel 311 may be coupled to a common mode voltage. Multiplexer 301 may couple input channel 311 to second multiplexer output channel 332. Second multiplexer output channel 332 may be coupled to a first end of switch 372 and a first end of switch 361.

In the example illustrated in FIG. 3, input channel 311 may be coupled to a common mode voltage. In other examples, any of input channels 310 may be coupled to a common mode voltage.

Channel sequencer 370, first conditioning circuit 391, second conditioning circuit 392, and switches 360, 361, 371, 372 may comprise control circuit 340. Control circuit 340 may couple multiplexer output channels 330 to ADC 390.

A second end of switch 371 may be coupled to first multiplexer output pin 381. First multiplexer output pin 381 may be coupled to an input of first conditioning circuit 391. First conditioning circuit 391 may include one or more amplifiers, a low-pass filter, a high-pass filter, a band-pass filter, a band-stop filter or other filter structures not specifically mentioned. First conditioning circuit 391 may include passive components, active components, or a combination of passive and active components. The output of first conditioning circuit 391 may be coupled to first ADC input pin 397. First ADC input pin 397 may be coupled to a positive input of ADC 390.

Switch 360 may be coupled between first multiplexer output channel 331 and the positive input of ADC 390, i.e. the second end of switch 360 may be coupled to the positive input of ADC 390.

In operation, in an external mode, switch 360 may be in an open position and switch 371 may be in a closed position, such that first ADC input pin 397 may provide input to the positive input of ADC 390. First conditioning circuit 391 may condition the signal received from first multiplexer output channel 331 at first multiplexer output pin 381 and provide the conditioned signal at the positive input of ADC 390 through first ADC input pin 397. In operation, in an internal mode, switch 360 may be in a closed position and switch 371 may be in an open position, such that first multiplexer output channel 331 may be input to the positive input of ADC 390 without passing through first conditioning circuit 391.

A second end of switch 372 may be coupled to second multiplexer output pin 382. Second multiplexer output pin 382 may be coupled to an input of second conditioning circuit 392. Second conditioning circuit 392 may include one or more amplifiers, a low-pass filter, a high-pass filter, a band-pass filter, a band-stop filter or other filter structures not specifically mentioned. Second conditioning circuit 392 may include passive components, active components, or a combination of passive and active components. The output of second conditioning circuit 392 may be coupled to second ADC input pin 396. Second ADC input pin 396 may be coupled to a negative input of ADC 390.

Switch 361 may be coupled between second multiplexer output channel 332 and the negative input of ADC 390, i.e. the second end of switch 361 may be coupled to the negative input of ADC 390.

In operation, in an external mode, switch 361 may be in an open position and switch 372 may be in a closed position, such that second ADC input pin 396 may provide input to the negative input of ADC 390. Second conditioning circuit 392 may condition the signal received from second multiplexer output channel 332 at second multiplexer output pin 382 and provide the conditioned signal at the negative input of ADC 390. In operation, in an internal mode, switch 361 may be in a closed position and switch 372 may be in an open position, such that second multiplexer output channel 332 may be input to the negative input of ADC 390 without passing through second conditioning circuit 392.

In operation, channel sequencer 370 may control multiplexer 301 to couple input channel 311 to second multiplexer output channel 332 and channel sequencer 370 may control multiplexer 301 and may instruct multiplexer 301 to sequentially couple one of input channels 312, 313, 314, 315, 316, 317, 318, 319, 320, 321, 322, 323, 324, 325, 326 to first multiplexer output channel 331. Input channel 311 may provide a common mode input. As one of various examples, during a first time period, channel sequencer 370 may instruct multiplexer 301 to couple input channel 311 to second multiplexer output channel 332 and to couple input channel 312 to first multiplexer output channel 331. Control circuit 340 may operate in either internal mode or external mode and may convert the pseudo-differential pair of input channel 311 and input channel 312 at ADC 390. During a second time period, channel sequencer 370 may instruct multiplexer 301 to couple input channel 311 to second multiplexer output channel 332 and to couple input channel 313 to first multiplexer output channel 331. Control circuit 340 may operate in either internal mode or external mode and may convert the differential pair of input channel 311 and input channel 313 at ADC 390. Channel sequencer 370 may continue to instruct multiplexer 301 to couple input channel 311 and one of input channels 312, 313, 314, 315, 316, 317, 318, 319, 320, 321, 322, 323, 324, 325 and 326 to ADC 390 and may enable multi-channel ADC system 300 to convert all input channels 310 in sequence in a pseudo-differential mode. In this manner, system 300 may implement a multi-channel ADC system.

The example of FIG. 3 illustrates a system for converting input channels in sequence, from input channel 312 to input channel 326, but this is not intended to be limiting. Channel sequencer 370 may instruct multiplexer 301 to couple input channels in any order. Channel sequencer 370 may instruct multiplexer 301 to couple all input channels or may couple a subset of input channels 310. In the example of FIG. 3, a common mode voltage may be provided at input channel 311, but this is not intended to be limiting. Any of input channels 310 may provide a common mode voltage.

Figure 4:
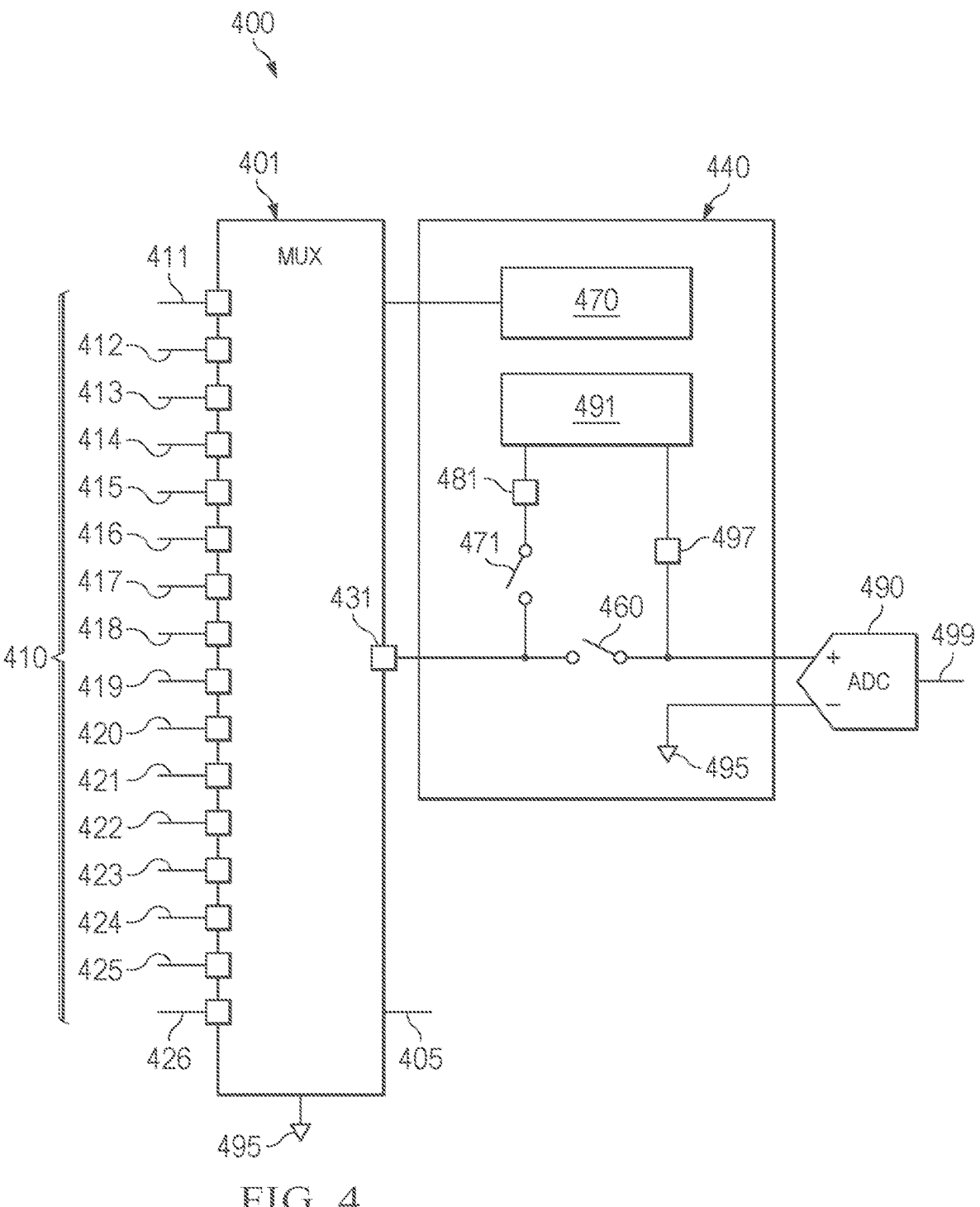
FIG. 4 illustrates one of various examples of a multi-channel ADC system in a single-ended configuration.

FIG. 4 illustrates one of various examples of a multi-channel ADC system 400 in a single-ended configuration. Input channels 401 may be single-ended inputs. Configuration setting 405 may specify one of a plurality of configurations. In the example illustrated in FIG. 4, configuration setting 405 may specify a plurality of channels in a single-ended configuration. Other examples may specify channels in other configurations. In one of various examples, configuration setting 405 may comprise an output of a 2-bit register setting. Multiplexer 401 may map one of input channels 410 to one of multiplexer output channels 431 based on configuration setting 405. Node 495 may be a common connection, including but not limited to a ground connection or a negative supply voltage.

Multi-channel ADC system 400 may include an ADC with one or more channels for converting one or more data inputs. Multi-channel ADC system 400 may include multiplexer 401 to couple one or more input channels 410 to one or more multiplexer output channels. A plurality of input channels 410 may be coupled to analog input signals. The example illustrated in FIG. 4 includes 16 inputs, but this is not intended to be limiting. In the example illustrated in FIG. 4, a channel sequencer 470 may control multiplexer 401 such that ADC 490 may convert any of the plurality of input channels 410. ADC 490 may generate digital code 499.

Multiplexer 401 may couple one or more of the plurality of input channels 410 to multiplexer output channel 431. In the example illustrated in FIG. 4, multiplexer 401 may include 16 input channels, individually labelled 411, 412, 413, 414, 415, 416, 417, 418, 419, 420, 421, 422, 423, 424,

425 and 426. Each of 16 input channels 411, 412, 413, 414, 415, 416, 417, 418, 419, 420, 421, 422, 423, 424, 425 and 426 may be coupled to a single-ended input signal. Some of the plurality of input channels 410 may be coupled to the same input signal. Some of the plurality of input channels 410 may be coupled to different input signals.

In the example illustrated in FIG. 4, multiplexer output channel 431 may be a single-ended channel. Multiplexer 401 may couple one of input channels 411, 412, 413, 414, 415, 416, 417, 418, 419, 420, 421, 422, 423, 424, 425, 426 to multiplexer output channel 431. Multiplexer output channel 431 may be coupled to a first end of switch 471 and to a first end of switch 460.

Channel sequencer 470, first conditioning circuit 491, and switches 460, 471 may comprise a control circuit 440. Control circuit 440 may couple multiplexer output channel 431 to ADC 490.

A second end of switch 471 may be coupled to multiplexer output pin 481. Multiplexer output pin 481 may be coupled to an input of conditioning circuit 491. Conditioning circuit 491 may include one or more amplifiers, a low-pass filter, a high-pass filter, a band-pass filter, a band-stop filter or other filter structures not specifically mentioned. Conditioning circuit 491 may include passive components, active components, or a combination of passive and active components. The output of conditioning circuit 491 may be coupled to ADC input pin 497. ADC input pin 497 may be coupled to a positive input of ADC 490.

A negative input of ADC 490 may be coupled to common node 495. Common node 495 maybe coupled to a ground voltage, a negative supply voltage, or a common potential, without limitation.

Switch 460 may be coupled between multiplexer output channel 431 and the positive input of ADC 490, i.e. the second end of switch 460 may be coupled to the positive input of ADC 490.

In operation, in an external mode, switch 460 may be in an open position and switch 471 may be in a closed position, such that ADC input pin 497 may provide input to the positive input of ADC 490. Conditioning circuit 491 may condition the signal received from multiplexer output channel 431 at output pin 481 and provide the conditioned signal at the positive input of ADC 490, through ADC input pin 497. In operation, in an internal mode, switch 460 may be in a closed position and switch 471 may be in an open position, such that multiplexer output channel 431 may be input to the positive input of ADC 490 without passing through conditioning circuit 491.

In operation, channel sequencer 470 may control multiplexer 401 and may instruct multiplexer 401 to sequentially couple one of input channels 411, 412, 413, 414, 415, 416, 417, 418, 419, 420, 421, 422, 423, 424, 425, 426 to multiplexer output channel 431. As one of various examples, during a first time period, channel sequencer 470 may instruct multiplexer 401 to couple input channel 411 to multiplexer output channel 431. Control circuit 440 may operate in either internal mode or external mode and may convert single-ended input channel 411 at ADC 490. During a second time period, channel sequencer 470 may instruct multiplexer 401 to couple input channel 412 to multiplexer output channel 431. Control circuit 440 may operate in either internal mode or external mode and may convert single-ended input channel 412 at ADC 490 and output digital code 499. Channel sequencer 470 may continue to instruct multiplexer 401 to, in numerical sequence, couple one of input channels 411, 412, 413, 414, 415, 416, 417, 418, 419, 420, 421, 422, 423, 424, 425 and 426 to ADC 490 and may enable system 400 to convert all input channels 410. In this manner, multi-channel ADC system 400 may implement a multi-channel ADC system.

The example of FIG. 4 illustrates a system for converting input channels in sequence, from input channel 411 to input channel 426, but this is not intended to be limiting. Channel sequencer 470 may instruct multiplexer 401 to couple input channels 410 in any order. Channel sequencer 470 may instruct multiplexer 401 to couple all input channels 410 or may couple a subset of input channels 410.

Figure 5:
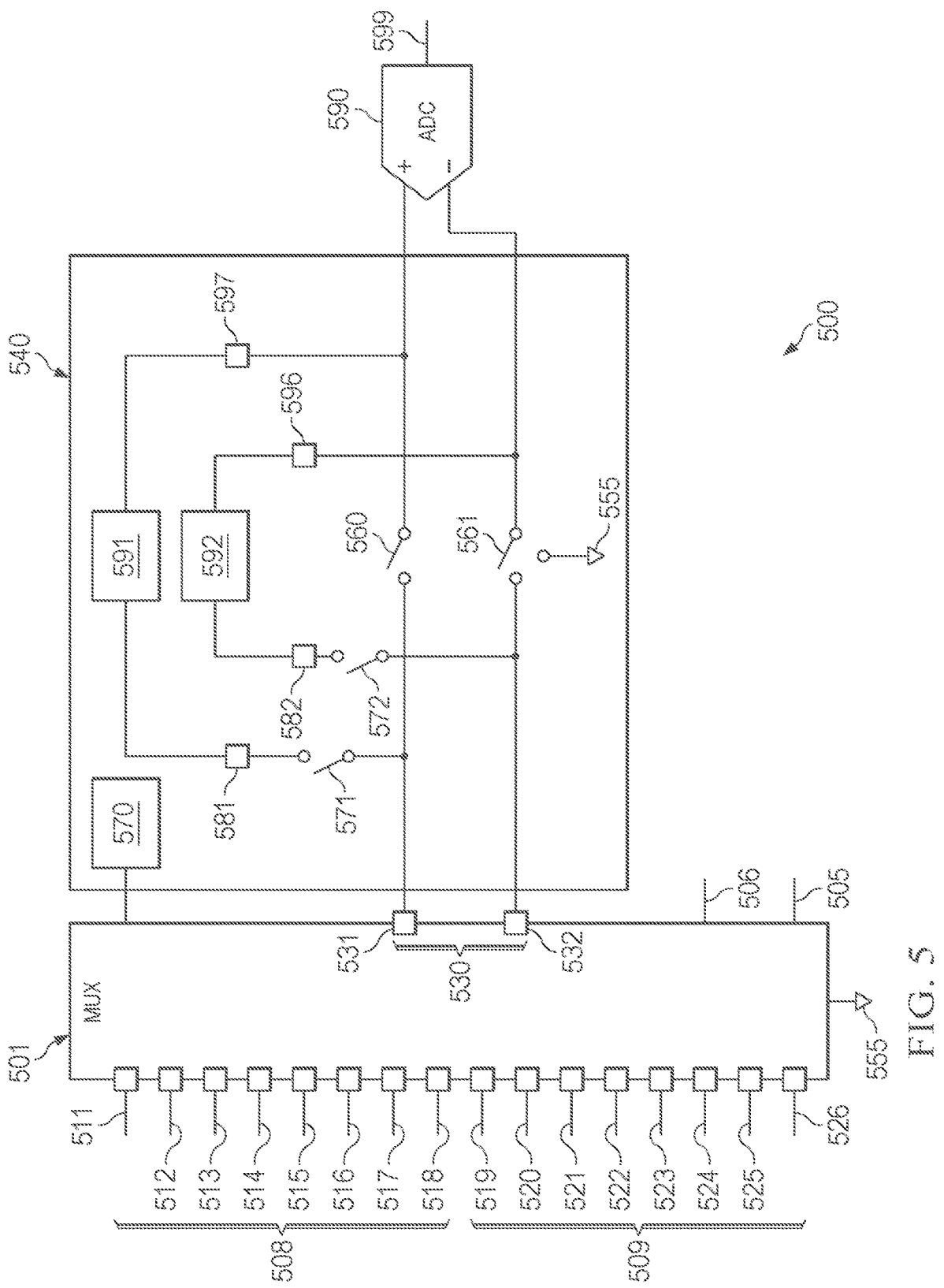
FIG. 5 illustrates one of various examples of a multi-channel ADC system in a hybrid configuration.

FIG. 5 illustrates one of various examples of a multi-channel ADC system 500 in a hybrid configuration. Configuration setting 505 may specify one of a plurality of configurations. In the example illustrated in FIG. 5, configuration setting 505 may specify a hybrid configuration. In a hybrid configuration, input channels 510 may include one or more single-ended channels and one or more differential channels. Configuration setting 505 may be a register setting comprising one or more bits. In one of various examples, configuration setting 505 may comprise an output of a 2-bit register setting. Multiplexer 501 may map one or more of input channels 510 to one or more of multiplexer output channels 530 based on configuration setting 505. Node 555 may be a common connection, including but not limited to a ground connection or a negative supply voltage.

In one of various examples, configuration setting 505 may specify the input channels in a hybrid configuration, where input channels 508 may be configured in pairs as differential input channels, and input channels 509 may be configured as single-ended input channels, the ordering of channels based on hybrid channel order configuration setting 506. In other examples, configuration setting 505 may specify the input channels in a hybrid configuration, where input channels 508 may be configured as single-ended input channels, and input channels 509 may be configured in pairs as differential input channels, the ordering of channels based on hybrid channel order configuration setting 506. Hybrid channel order configuration setting 506 may select other channel orders than those explicitly mentioned. As one of various examples, hybrid channel order configuration setting 506 may be set to a first configuration and input channels 508 may be differential input pairs and input channels 509 may be single-ended inputs, and hybrid channel order configuration setting 506 may be set to a second configuration and input channels 508 may be single-ended inputs and input channels 509 may be differential input pairs.

In the example illustrated in FIG. 5, the hybrid configuration may comprise a first set of input channels 508 operating in a single-ended configuration and a second set of input channels 509 operating in a differential configuration, based upon hybrid channel order configuration setting 506.

Multi-channel ADC system 500 may include an ADC 590 with two or more channels for converting two or more data inputs. Multi-channel ADC system 500 may include multiplexer 501 to couple one or more input channels 508, 509 to one or more multiplexer output channels 530. A plurality of input channels 508, 509 may be coupled to analog input signals. The example illustrated in FIG. 5 includes 16 inputs, but this is not intended to be limiting. In the example illustrated in FIG. 5, a channel sequencer 570 may control multiplexer 501 such that ADC 590 may convert the plurality of input channels 508, 509. ADC 590 may output digital code 599.

Multiplexer 501 may couple one or more of the plurality of input channels 508, 509 to one or more of a plurality of multiplexer output channels 530. In the example illustrated in FIG. 5, multiplexer 501 may include 16 input channels, individually labelled 511, 512, 513, 514, 515, 516, 517, 518, 519, 520, 521, 522, 523, 524, 525 and 526. Each of 16 input channels 511, 512, 513, 514, 515, 516, 517, 518, 519, 520, 521, 522, 523, 524, 525 and 526 may be coupled to an input signal. In the example illustrated in FIG. 5, input channels 508 may include input channels 511, 512, 513, 514, 515, 516, 517, 518 configured as single-ended inputs based on hybrid channel order configuration setting 506. In the example illustrated in FIG. 5, input channels 509 may include input channels 519, 520, 521, 522, 523, 524, 525, 526 configured as differential inputs based on hybrid channel order configuration setting 506.

In the example illustrated in FIG. 5, multiplexer output channels 530 may be either single-ended or differential channels. First multiplexer output channel 531 may be coupled to a first end of switch 571 and to a first end of switch 560. Second multiplexer output channel 532 may be coupled to a first end of switch 572 and to a first end of switch 561.

Channel sequencer 570, first conditioning circuit 591, second conditioning circuit 592 and switches 560, 561, 571, 572 may comprise a control circuit 540. Control circuit 540 may couple multiplexer output channels 530 to ADC 590.

A second end of switch 571 may be coupled to first multiplexer output pin 581. First multiplexer output pin 581 may be coupled to an input of first conditioning circuit 591. First conditioning circuit 591 may include one or more amplifiers, a low-pass filter, a high-pass filter, a band-pass filter, a band-stop filter or other filter structures not specifically mentioned. First conditioning circuit 591 may include passive components, active components, or a combination of passive and active components. The output of first conditioning circuit 591 may be coupled to first ADC input pin 597. First ADC input pin 597 may be coupled to a positive input of ADC 590.

Switch 560 may be coupled between first multiplexer output channel 531 and the positive input of ADC 590, i.e. the second end of switch 560 may be coupled to the positive input of ADC 590.

In operation, in an external mode, switch 560 may be in an open position and switch 571 may be in a closed position, such that first ADC input pin 597 may provide input to the positive input of ADC 590. First conditioning circuit 591 may condition the signal received from the first multiplexer output channel 531 at first multiplexer output pin 581 and provide the conditioned signal at the positive input of ADC 590 through first ADC input pin 597. In operation, in an internal mode, switch 560 may be in a closed position and switch 571 may be in an open position, such that first multiplexer output channel 531 may be input to the positive input of ADC 590 without passing through first conditioning circuit 591.

A second end of switch 572 may be coupled to second multiplexer output pin 582. Second multiplexer output pin 582 may be coupled to an input of second conditioning circuit 592. Second conditioning circuit 592 may include one or more amplifiers, a low-pass filter, a high-pass filter, a band-pass filter, a band-stop filter or other filter structures not specifically mentioned. Second conditioning circuit 592 may include passive components, active components, or a combination of passive and active components. The output of second conditioning circuit 592 may be coupled to second ADC input pin 596. Second ADC input pin 596 may be coupled to a negative input of ADC 590.

Switch 561 may be coupled between second multiplexer output channel 532 and the negative input of ADC 590, i.e. the second end of switch 561 may be coupled to the negative input of ADC 590.

In operation, in an external mode, switch 561 may be in an open position and switch 572 may be in a closed position, such that second ADC input pin 596 may provide input to the negative input of ADC 590. Second conditioning circuit 592 may condition the signal received from second multiplexer output channel 532 at second multiplexer input pin 582 and may provide the conditioned signal at the negative input of ADC 590 through second ADC input pin 596. In operation, in an internal mode, switch 561 may be in a closed position and switch 572 may be in an open position, such that second multiplexer output channel 532 may be input to the negative input of ADC 590 without passing through second conditioning circuit 592.

In operation, channel sequencer 570 may control multiplexer 501 and may instruct multiplexer 501 to couple one or more of input channels 508, 509 to multiplexer output channels 530. In the hybrid configuration example of FIG. 5, channel sequencer 570 may instruct multiplexer 501 to sequentially couple input channels 511, 512, 513, 514, 515, 516, 517, and 518 as single-ended inputs, based on hybrid channel order configuration setting 506. As one of various examples, during a first time period, channel sequencer 570 may instruct multiplexer 501 to couple input channel 511 to first multiplexer output channel 531. Switch 561 may couple the negative input of ADC 590 to ground node 555 in a single-ended mode. Control circuit 540 may operate in either internal mode or external mode and may convert single-ended input channel 511 at ADC 590. During a second time period, channel sequencer 570 may instruct multiplexer 501 to couple input channel 512 to first multiplexer output channel 531. Switch 561 may couple the negative input of ADC 590 to ground node 555 in a single-ended mode. Control circuit 540 may operate in either internal mode or external mode and may convert the single-ended input channel 512 at ADC 590. Channel sequencer 570 may continue to instruct multiplexer 501 to couple input channels 512, 514, 515, 516, 517, 518 to ADC 590 and may enable system 500 to convert all input channels 508 in a single-ended mode.

During a third time period, the third time period occurring after the second time period, but not necessarily following immediately after the second time period, channel sequencer 570 may instruct multiplexer 501 to couple input channel 519 to first multiplexer output channel 531 and to couple input channel 520 to second multiplexer output channel 532. In the hybrid configuration, input channels 508 may be single-ended input channels and input channels 509 may be differential channels. Control circuit 540 may operate in either internal mode or external mode and may convert the pair of differential input channels 519, 520 at ADC 590. During a fourth time period, channel sequencer 570 may instruct multiplexer 501 to couple input channel 521 to first multiplexer output channel 531 and to couple input channel 522 to second multiplexer output channel 532. Control circuit 540 may operate in either internal mode or external mode and may convert pair of differential input channels 521, 522 at ADC 590. Channel sequencer 570 may continue to instruct multiplexer 501 to couple pairs of input channels 523, 524, 525 and 526 to ADC 590 and may enable system 500 to convert all input channels 508, 509. In this manner, system 500 may implement a multi-channel ADC system.

In this manner, system 500 may implement a multi-channel ADC system.

The example of FIG. 5 illustrates a system for converting input channels in sequence, from input channel 511 to input channel 526, but this is not intended to be limiting. Channel sequencer 570 may instruct multiplexer 501 to couple input channels in any order. Channel sequencer 570 may instruct multiplexer 501 to couple all input channels, or may couple a subset of input channels 508, 509.

In the example illustrated in FIG. 5, for a first setting of hybrid channel order configuration setting 506, input channels 508 may be configured as single-ended inputs and input channels 509 may be configured as differential channels. For a second setting of hybrid channel order configuration setting 506, input channels 508 may be configured as differential inputs and input channels 509 may be configured as single-ended inputs.

Figure 6:
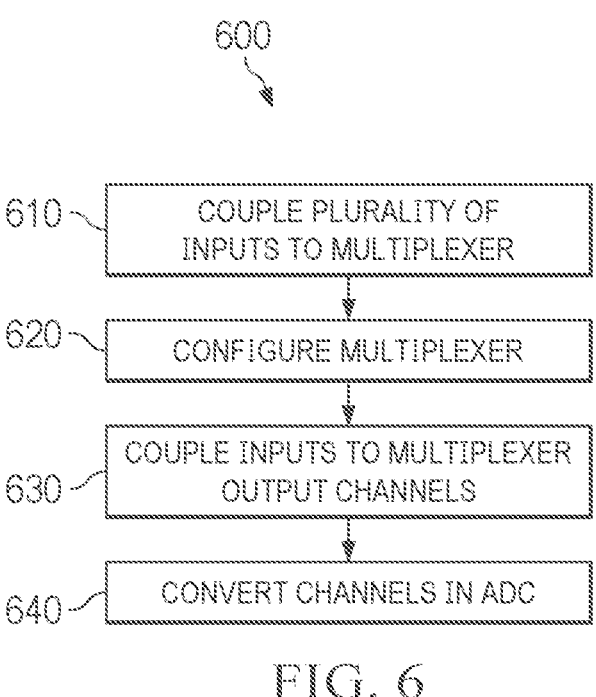
FIG. 6 illustrates one of various examples of a method of configuring a multi-channel ADC.

FIG. 6 illustrates one of various examples of a method of configuring a multi-channel ADC.

In operation 610, a plurality of inputs may be coupled to a multiplexer.

In operation 620, the multiplexer may be configured into one of a plurality of configurations. Configurations include but are not limited to single-ended, differential, pseudo-differential or a combination of single-ended, differential and pseudo-differential. Configurations may be set based on a register setting, voltages on external pins, or another method. Configuration may be set by a software algorithm or in hardware.

In operation 630, the multiplexer may couple the plurality of inputs to a plurality of multiplexer output channels. In one of various examples, the multiplexer may couple inputs to multiplexer output channels sequentially in a single-ended mode. In other examples, the multiplexer may couple pairs of inputs to multiplexer output channels sequentially in a differential mode. In other examples, the multiplexer may couple a portion of the inputs to multiplexer output channels in a single-ended mode and may couple a portion of the inputs to multiplexer output channels in pairs in a differential mode.

In operation 640, and ADC may convert the multiplexer output channels to digital signals.

The invention claimed is:

1. A multi-channel ADC system comprising:
a configuration setting to configure a plurality of input signals in one of a plurality of configurations, the configuration setting comprising a 2-bit register value;
a multiplexer coupled to the plurality of input signals, the multiplexer to couple at least one of the plurality of input signals to at least one multiplexer output channel based on the configuration setting;
an analog-to-digital converter (ADC); and
a control circuit comprising:
at least one switch to selectively couple at least one multiplexer output channel to at least one multiplexer output pin;
a conditioning circuit with an input coupled to at least one multiplexer output pin and an output coupled to an ADC input pin; and
the ADC input pin coupled to an input of the ADC,
wherein the control circuit to couple the at least one multiplexer output channel to the ADC, the ADC to convert the at least one multiplexer output channel.

2. The system as claimed in claim 1, the configuration setting to configure the plurality of input signals as single-ended inputs in a single-ended configuration, the multiplexer to couple one of the plurality of input signals to one multiplexer output channel and the control circuit to couple the one multiplexer output channel to the ADC.

3. The system as claimed in claim 2, the control circuit comprising a channel sequencer to sequentially couple respective ones of the plurality of input signals to the one multiplexer output channel.

4. The system as claimed in claim 1, the conditioning circuit comprising at least one of: a low-pass filter, a high-pass filter, a band-pass filter and a band-stop filter.

5. The system as claimed in claim 1, the configuration setting to configure the plurality of input signals as differential inputs in a differential configuration, the multiplexer to couple two of the plurality of input signals to two multiplexer output channels and the control circuit to couple the first multiplexer output channel to a positive input of the ADC and the control circuit to couple the second multiplexer output channel to a negative input of the ADC.

6. The system as claimed in claim 5, the control circuit comprising a channel sequencer to sequentially couple the plurality of input signals in pairs to the two multiplexer output channels.

7. The system as claimed in claim 6, the system comprising 8 differential input signals.

8. The system as claimed in claim 7, the control circuit comprising:
a switch to selectively couple the two multiplexer output channels to two output pins;
a first conditioning circuit comprising:
a first input coupled to the first multiplexer output pin;
a first output coupled to a first ADC input pin;
a second conditioning circuit comprising:
a second input coupled to the second multiplexer output pin;
a second output coupled to a second ADC input pin; and
wherein the first ADC input pin coupled to a positive input of the ADC and the second ADC input pin coupled to a negative input of the ADC.

9. The system as claimed in claim 1, the configuration setting to configure a first of the plurality of input signals as a common mode input and a second of the plurality of input signals as pseudo-differential inputs in a pseudo-differential configuration, the multiplexer to couple the second of the plurality of input signals to a first multiplexer output channel as a signal input and the multiplexer to couple a first of the plurality of input signals to a second multiplexer output channel as a common mode input, and the control circuit to couple the first multiplexer output channel to a positive input of the ADC and the control circuit to couple the second multiplexer output channel to a negative input of the ADC.

10. The system as claimed in claim 9, the control circuit comprising a channel sequencer to sequentially couple the remaining plurality of input signals to the second multiplexer output channel.

11. The system as claimed in claim 10, the system comprising 1 common mode input signal and 15 pseudo-differential input signals.

12. The system as claimed in claim 10, the control circuit comprising:
a switch to selectively couple the two multiplexer output channels to two multiplexer output pins;
a first conditioning circuit comprising:
a first input coupled to the first multiplexer output pin;
a first output coupled to a first ADC input pin;
a second conditioning circuit comprising:
a second input coupled to the second multiplexer output pin;
a second output coupled to a second ADC input pin; and wherein the first ADC input pin coupled to a positive input of the ADC and the second ADC input pin coupled to a negative input of the ADC.

13. The system as claimed in claim 1, the configuration setting to configure the plurality of input signals in a hybrid configuration, wherein a first set of the plurality of input signals are configured as single-ended inputs and second set of the plurality of input signals are configured as differential inputs.

14. The system as claimed in claim 13, the control circuit comprising a channel sequencer to sequentially couple the single-ended inputs to a multiplexer output channel, and to sequentially couple the differential input signals in pairs to two multiplexer output channels.

15. The system as claimed in claim 14, the system comprising 8 single-ended input signals and 8 differential inputs comprising 4 differential input pairs.

16. The system as claimed in claim 14, the control circuit comprising:
a switch to selectively couple the two multiplexer output channels to two output pins;
a first conditioning circuit comprising:
a first input coupled to the first multiplexer output pin;
a first output coupled to a first ADC input pin;
a second conditioning circuit comprising:
a second input coupled to the second multiplexer output pin;
a second output coupled to a second ADC input pin; and
wherein the first ADC input pin coupled to a positive input of the ADC and the second ADC input pin coupled to a negative input of the ADC.

17. A method comprising:
coupling a plurality of input signals to a multiplexer;
configuring the multiplexer in one of a plurality of configurations based on a configuration setting, the configuration setting comprising a 2-bit register value;
coupling, in the multiplexer, at least one of a plurality of inputs to at least one multiplexer output channel, the coupling based on the configuration setting,
conditioning the output of the at least one multiplexer output channel in a conditioning circuit, the conditioning circuit based on the configuration setting, and
converting the at least one multiplexer output channel in an analog-to-digital converter (ADC).

18. The method as claimed in claim 17, the conditioning circuit to implement as least one of: a low-pass filter, a high-pass filter, a band-pass filter and a band-stop filter.

19. The method as claimed in claim 17, the configuration setting comprising a single-ended mode, the plurality of inputs to be converted sequentially by the ADC in a single-ended mode.

20. The method as claimed in claim 17, the configuration setting comprising a differential mode, the plurality of inputs to be converted sequentially in pairs by the ADC in a differential mode.

21. The method as claimed in claim 17, the configuration setting comprising a pseudo-differential mode, a first of the plurality of inputs comprising a common mode input, the first of the plurality of inputs coupled to a first multiplexer output channel, the first multiplexer output channel coupled to a negative input of the ADC and the remaining plurality of inputs coupled sequentially to a second multiplexer output channel and the second multiplexer output channel coupled to a positive input of the ADC.

22. The method as claimed in claim 17, the configuration comprising a hybrid configuration, the hybrid configuration comprising coupling at least one of the plurality of input signals to one multiplexer output channel in a single-ended mode and coupling at least two of the plurality of input signals to two multiplexer output channels in a differential mode.

23. The method as claimed in claim 17, the configuration comprising a hybrid configuration, the hybrid configuration comprising coupling at least one of the plurality of input signals to one multiplexer output channel in a single-ended mode and coupling at least two of the plurality of input signals to two multiplexer output channels in a differential mode.

* * * * *